United States Patent
Sandoh

(10) Patent No.: US 12,341,068 B2
(45) Date of Patent: Jun. 24, 2025

(54) METHOD OF MANUFACTURING CHIPS

(71) Applicant: DISCO CORPORATION, Tokyo (JP)

(72) Inventor: Hideyuki Sandoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 476 days.

(21) Appl. No.: 17/819,018

(22) Filed: Aug. 11, 2022

(65) Prior Publication Data

US 2023/0066651 A1 Mar. 2, 2023

(30) Foreign Application Priority Data

Aug. 25, 2021 (JP) ................. 2021-137092

(51) Int. Cl.
*H01L 21/78* (2006.01)
*H01L 21/304* (2006.01)
*H01L 21/683* (2006.01)

(52) U.S. Cl.
CPC ............ *H01L 21/78* (2013.01); *H01L 21/304* (2013.01); *H01L 21/6836* (2013.01); *H01L 2221/68327* (2013.01); *H01L 2221/6834* (2013.01)

(58) Field of Classification Search
CPC ...... H10H 20/021; H01L 21/304; H01L 21/78
See application file for complete search history.

(56) References Cited

U.S. PATENT DOCUMENTS

| 2004/0097084 A1* | 5/2004 | Fukuda ................. B24B 9/065 438/690 |
| 2004/0121556 A1* | 6/2004 | Kim ................... H01L 25/0657 257/E21.705 |
| 2018/0068895 A1 | 3/2018 | Sandoh |
| 2020/0043788 A1* | 2/2020 | Nakamura .......... H01L 21/6836 |
| 2020/0066569 A1 | 2/2020 | Priewasser et al. |

FOREIGN PATENT DOCUMENTS

| JP | 2015023093 A | 2/2015 |
| JP | 2016192463 A | 11/2016 |
| JP | 2018041765 A | 3/2018 |
| JP | 2019166598 A | 10/2019 |
| JP | 2020031511 A | 2/2020 |
| JP | 2020113614 A | 7/2020 |

OTHER PUBLICATIONS

Office Action issued by the Patent Office of Japan for corresponding Patent Application No. 2021-037092, mailed Apr. 10, 2025.

* cited by examiner

*Primary Examiner* — Yu-Hsi D Sun
(74) *Attorney, Agent, or Firm* — GREER BURNS & CRAIN, LTD.

(57) ABSTRACT

An outer circumferential region of a metal film and a portion of an outer circumferential region of a substrate on a reverse side thereof are removed, thereby exposing the outer circumferential region of the substrate and creating on a reverse side of an outer circumferential region of the wafer an exposed surface where a portion closer to a face side of a wafer is located outwardly of a portion remoter from the face side of the wafer. When a tape is affixed to a reverse side of the wafer, no gap or a reduced gap is formed between the tape and the outer circumferential region of the wafer. As a result, problems are restrained from occurring when the wafer is divided to manufacture chips therefrom.

8 Claims, 10 Drawing Sheets

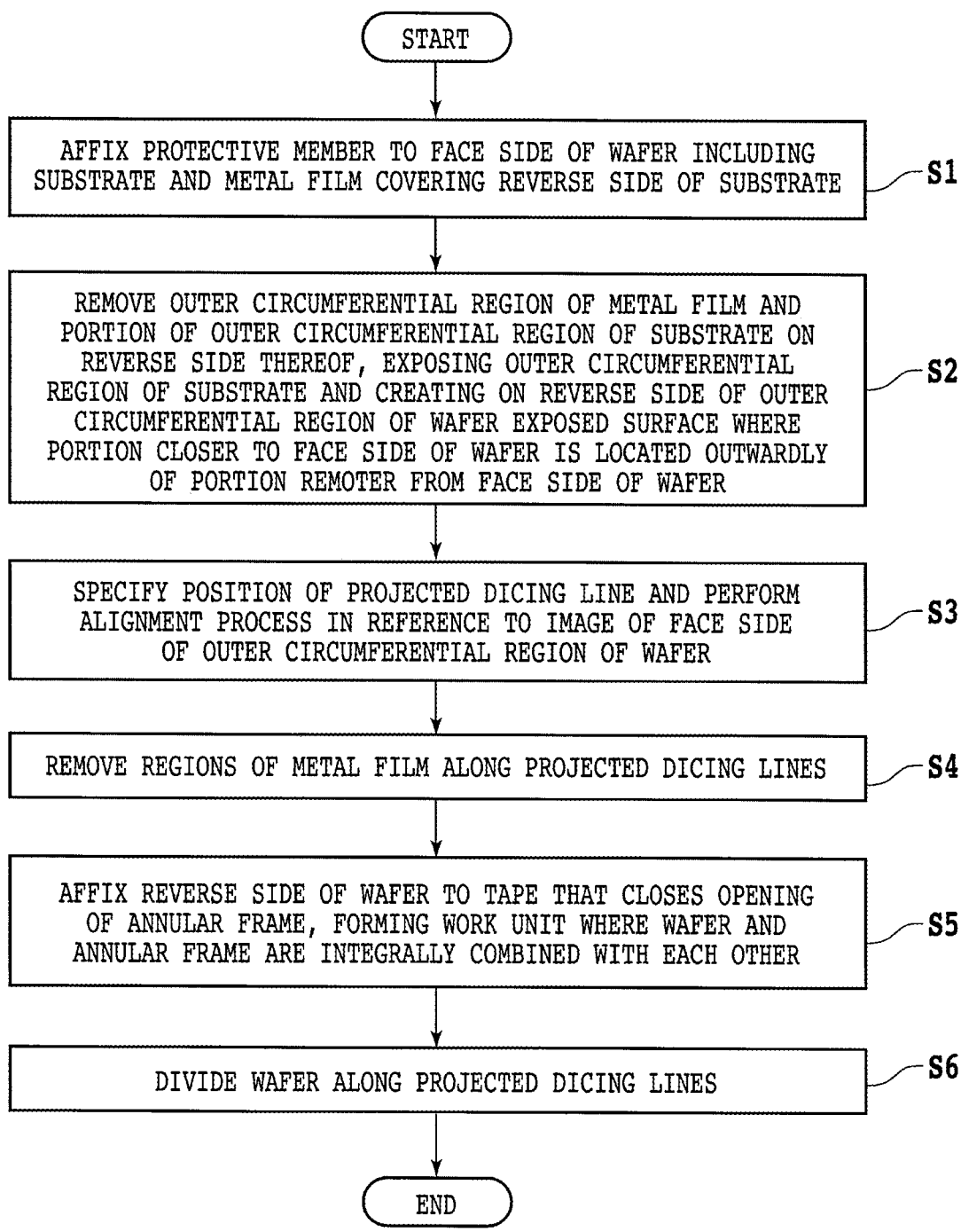

METHOD OF MANUFACTURING CHIPS

BACKGROUND OF THE INVENTION

Field of the Invention

The present invention relates to a method of manufacturing chips by dividing a wafer along a grid of projected dicing lines established thereon.

Description of the Related Art

Chips of vertical-structure power devices are typically manufactured by dividing a wafer along a grid of projected dicing lines established thereon. The wafer has, for example, a disk-shaped substrate that is made of a semiconductor material and that has a face side where an impurity region doped with an impurity is formed.

Moreover, metal films functioning as electrodes are provided on both surfaces of the wafer. Specifically, electrode patterns including a plurality of patterned metal films are provided on respective face sides of a plurality of areas that are demarcated on the wafer by the projected dicing lines. A metal film covering the entire reverse side of the substrate is provided on a reverse side of the wafer.

For dividing the wafer along the projected dicing lines, it is necessary to divide the substrate together with the metal film on the reverse side of the substrate. However, processes suitable for dividing a substrate made of a semiconductor material may not necessarily be processes suitable for dividing a metal film. Therefore, if one process is used to divide both a substrate and a metal film thereon, then the processing quality may possibly become worse.

In view of the above problems, there has been proposed in the art a method of removing regions of a metal film along projected dicing lines on a substrate prior to dividing the substrate along the projected dicing lines (see, for example, Japanese Patent Laid-open No. 2020-113614). According to the proposed method, specifically, an annular cutting blade that is rotating about its central axis is brought into contact with a metal film on a reverse side of a substrate along an outer circumferential edge of a wafer. The cutting blade removes part of the metal film and part of the substrate, exposing the reverse side of the substrate in an outer circumferential region thereof.

Next, in reference to an image captured of a face side of an outer circumferential region of the wafer from a reverse side of the wafer, i.e., the reverse side of the substrate, by use of light having a wavelength transmittable through the substrate, the position of a projected dicing line is identified, and an alignment process is performed to bring the wafer and the cutting blade into positional alignment with each other. Then, the rotating annular cutting blade is brought into contact with regions of the metal film along the projected dicing lines, thereby removing the regions of the metal film along the projected dicing lines from the reverse side of the substrate.

Subsequently, the reverse side of the wafer is affixed to a tape attached to an annular frame in covering relation to the opening of the annular frame, thereby making up a work unit where the wafer and the annular frame are integrally combined with each other. Following this, a mask having openings defined in regions thereof along the projected dicing lines on the substrate is placed on a face side of the substrate.

Then, the work unit is placed in a chamber, and the chamber is evacuated. Plasma etching is performed on the substrate through the mask from the face side of the substrate, thereby dividing the wafer into chips without making the processing quality worse at the time of dividing the wafer along the projected dicing lines.

SUMMARY OF THE INVENTION

According to the above method, an outer circumferential region of the metal film and the reverse side of the outer circumferential region of the substrate are removed in order to expose the reverse side of the outer circumferential region of the substrate. Accordingly, a step is formed on a reverse side of the outer circumferential region of the wafer. According to the above method, then, the tape is affixed to the reverse side of the wafer, forming the work unit, after which plasma etching is performed on the substrate included in the work unit.

When the tape is affixed to the reverse side of the wafer, the tape may not be affixed to the wafer neatly along the step on the reverse side of the outer circumferential region of the wafer. In other words, the work unit that has been formed may possibly have gaps between the tape and the outer circumferential region of the wafer.

In a case where the wafer is divided by plasma etching, the chamber in which the work unit is placed needs to be evacuated. Consequently, if the gaps are present between the tape and the outer circumferential region of the wafer, air in the gaps may be expanded under the vacuum in the chamber, possibly peeling the tape off from the outer circumferential region of the wafer.

Moreover, if the gaps are present between the tape and the outer circumferential region of the wafer, the tape is not sufficiently affixed to the outer circumferential region of the wafer. Accordingly, problems may also arise in a case where the wafer is divided by processes other than plasma etching.

For example, in a case where the wafer is divided by an annular cutting blade, the wafer is liable to be moved by the cutting blade that is rotating while dividing the wafer. As a result, chips produced by the wafer being divided may possibly produce fragments called chippings from their ends.

In a case where a laser beam is applied to the wafer to form modified layers in the wafer and then external forces are exerted on the wafer to divide the wafer along the modified layers that function as division initiating points, chips may possibly fly off from the wafer when the external forces are exerted on the wafer. Specifically, after the wafer is divided, chips including part of the outer circumferential region of the wafer may be peeled off from the tape and fly off.

In a case where the wafer is divided by laser ablation, the wafer is heated by a laser beam that is applied to the wafer to give rise to laser ablation. Hence, if the gaps are present between the tape and the outer circumferential region of the wafer, air in the gaps may be expanded by the heated wafer, possibly peeling the tape off from the outer circumferential region of the wafer.

In view of abovementioned difficulties, it is an object of the present invention to provide a method of manufacturing chips by dividing a wafer where a tape is affixed to a reverse side thereof with a metal film provided on the reverse side.

In accordance with an aspect of the present invention, there is provided a method of manufacturing chips by dividing a wafer that includes a substrate and a metal film covering a reverse side of the substrate along a grid of projected dicing lines on the wafer, the method including a protective member affixing step of affixing a protective member to a face side of the wafer that is positioned opposite the metal film, an exposed surface creating step of, after the protective member affixing step, while the wafer is being held through the protective member, removing an outer circumferential region of the metal film and a portion of an outer circumferential region of the substrate on the reverse side thereof, thereby exposing the outer circumferential region of the substrate and creating on a reverse side of an outer circumferential region of the wafer an exposed surface where a portion closer to the face side of the wafer is located outwardly of a portion remoter from the face side of the wafer, an alignment step of, after the exposed surface creating step, specifying the position of a projected dicing line and performing an alignment process in reference to an image captured of a face side of the outer circumferential region of the wafer by applying light having a wavelength transmittable through the substrate from a reverse side of the wafer, a metal film removing step of, after the alignment step, removing regions of the metal film along the projected dicing lines while the wafer is being held through the protective member, a work unit forming step of, after the metal film removing step, removing the protective member from the face side of the wafer and affixing the reverse side of the wafer to a tape that closes an opening of an annular frame, thereby forming a work unit where the wafer and the annular frame are integrally combined with each other, and a dividing step of, after the work unit forming step, dividing the wafer along the projected dicing lines while the wafer is being held through the tape.

Preferably, the dividing step includes the steps of placing a mask having openings defined in regions thereof along the projected dicing lines on the face side of the wafer and thereafter performing plasma etching on the substrate through the mask, thereby dividing the wafer.

Preferably, the dividing step alternatively includes the step of bringing a rotating annular blade for dividing a substrate into contact with the substrate from a face side thereof along the projected dicing lines, thereby dividing the wafer.

Preferably, the dividing step alternatively includes the steps of forming modified layers within the substrate by applying a laser beam having a wavelength transmittable through the substrate and a focused spot positioned within the substrate to the substrate from a face side thereof along the projected dicing lines, and thereafter exerting external forces on the substrate, thereby dividing the wafer at the modified layers that function as division initiating points.

Preferably, the dividing step alternatively includes the step of applying a laser beam having a wavelength absorbable by the substrate to the substrate from a face side thereof along the projected dicing lines, thereby dividing the wafer.

Preferably, the metal film removing step includes the step of bringing a rotating annular cutting blade for removing a metal film into contact with the metal film, thereby removing the regions of the metal film along the projected dicing lines.

Preferably, the metal film removing step alternatively includes the step of applying a laser beam having a wavelength absorbable by the metal film to the metal film, thereby removing the regions of the metal film along the projected dicing lines.

Preferably, the exposed surface creating step includes the step of bringing a rotating annular cutting blade for creating an exposed surface into contact with the metal film and the substrate, thereby removing the outer circumferential region of the metal film and the portion of the outer circumferential region of the substrate on the reverse side thereof.

According to the present invention, before the work unit is formed, the outer circumferential region of the metal film and a portion of the outer circumferential region of the substrate on the reverse side thereof are removed, exposing the outer circumferential region of the substrate and creating on the reverse side of the outer circumferential region of the wafer an exposed surface where a portion closer to the face side of the wafer is located outwardly of a portion remoter from the face side of the wafer. When a tape is affixed to the reverse side of the wafer, no gap or a reduced gap is formed between the tape and the outer circumferential region of the wafer. As a result, problems are restrained from occurring when the wafer is divided to manufacture chips therefrom.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 2 is a flowchart schematically illustrating a method of manufacturing chips according to an embodiment of the present invention;

DETAILED DESCRIPTION OF THE PREFERRED EMBODIMENTS

Figure 1A:
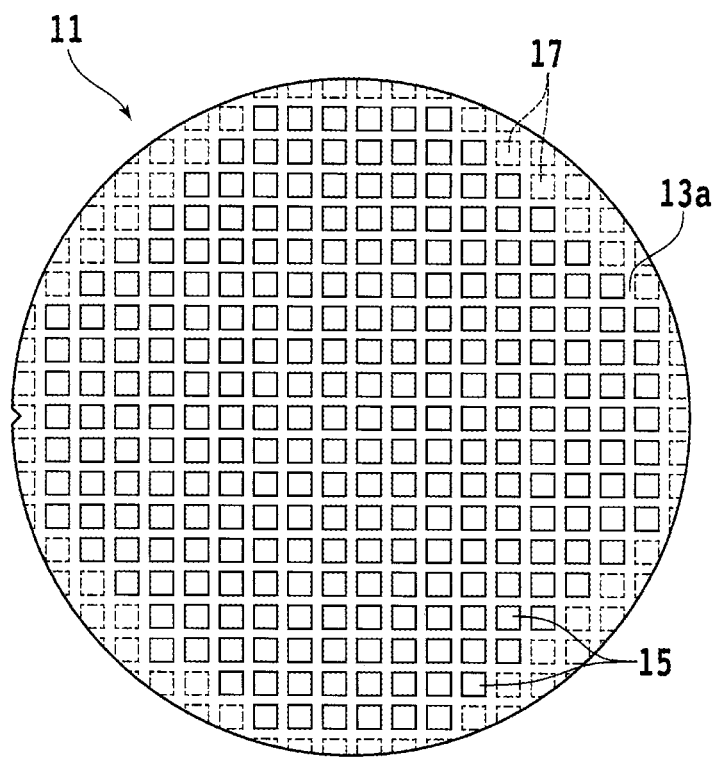
FIG. 1A is a plan view schematically illustrating a wafer by way of example.
Figure 1B:
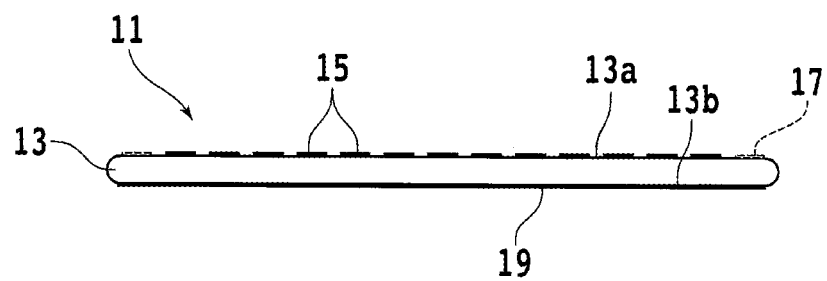
FIG. 1B is a side elevational view schematically illustrating the wafer by way of example.

Preferred embodiments of the present invention will be described hereinbelow with reference to the accompanying drawings. FIG. 1A schematically illustrates in plan a wafer 11 by way of example, and FIG. 1B schematically illustrates in side elevation the wafer 11 by way of example. As illustrated in FIGS. 1A and 1B, the wafer 11 has a substrate 13. The substrate 13 is made of a semiconductor material such as silicon (Si) that reflects visible light and transmits infrared rays therethrough, for example.

The wafer 11 includes a region that is used to manufacture devices therefrom, i.e., a device region, and an outer circumferential region surrounding the device region. The outer circumferential region cannot be used to manufacture devices therefrom primarily because it is unable to provide a surface area or a degree of flatness necessary for the fabrication of devices therefrom.

The device region of the wafer 11 has a plurality of areas demarcated by a grid of projected dicing lines established thereon. Electrode patterns 15 are disposed on face sides of the demarcated areas, i.e., a face side 13a of the substrate 13. In FIGS. 1A and 1B, each of the electrode patterns 15 is shaped as a rectangular parallelepiped indicated by solid lines for illustrative purposes, and includes a plurality of electrodes patterned to a desired shape, for example.

The outer circumferential region of the wafer 11 also has a plurality of areas demarcated by the grid of projected dicing lines established thereon. Dummy patterns 17 are disposed on face sides of the demarcated areas. In FIGS. 1A and 1B, each of the dummy patterns 17 is shaped as a rectangular parallelepiped indicated by broken lines for illustrative purposes, and is of a structure similar to the electrode patterns 15 except a portion where no electrodes can be provided in the absence of the substrate 13, for example.

A metal film 19 is disposed on a reverse side of the wafer 11 in covering relation to an entire reverse side 13b of the substrate 13. When the wafer 11 is divided along the projected dicing lines, chips of vertical-structure power devices including part of the substrate 13 and part of the electrode patterns 15 and the metal film 19 are fabricated from the device region of the wafer 11.

The substrate 13 is not limited to any particular materials, shapes, structures, sizes, etc. The substrate 13 may be made of a semiconductor material such as silicon carbide (SiC) or gallium arsenide (GaN) other than silicon. Similarly, the chips to be fabricated from the wafer 11 are not limited to any particular kinds, numbers, shapes, structures, sizes, layouts, etc.

FIG. 2 is a flowchart schematically illustrating a method of manufacturing chips from the wafer 11 according to an embodiment of the present invention. According to the method, a protective member is affixed to a face side of the wafer 11 that includes the substrate 13 and the metal film 19 disposed in covering relation to the reverse side 13b of the substrate 13 (protective member affixing step S1).

Figure 3A:
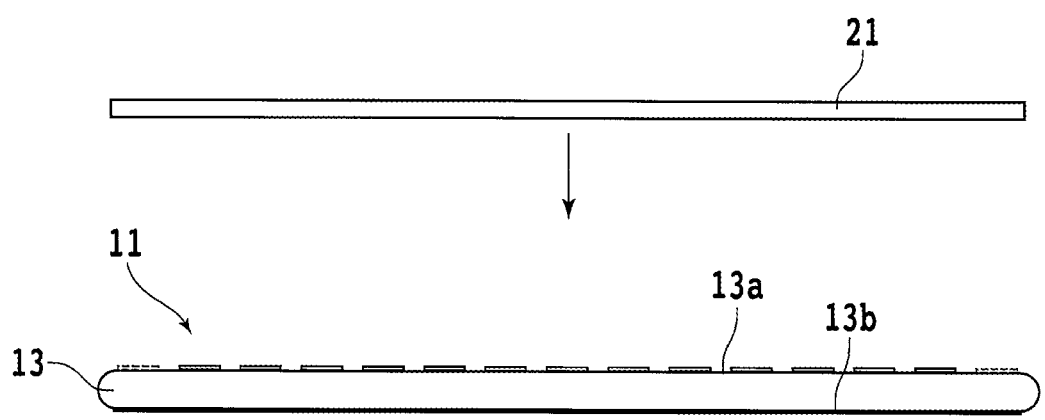
FIG. 3A is a side elevational view schematically illustrating a protective member affixing step.
Figure 3B:
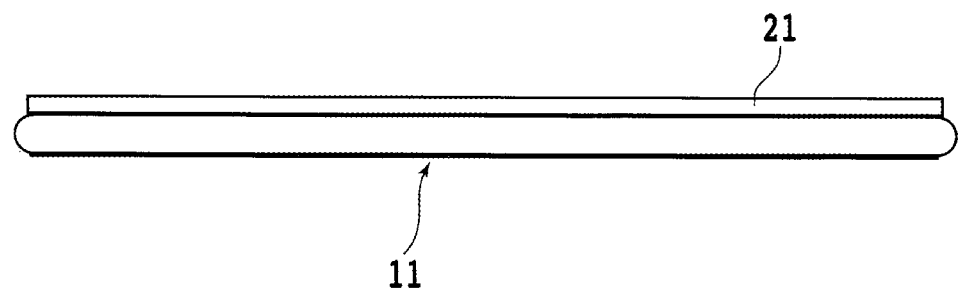
FIG. 3B is a side elevational view schematically illustrating the wafer that has undergone the protective member affixing step.

FIG. 3A schematically illustrates in side elevation a protective member affixing step S1, and FIG. 3B schematically illustrates in side elevation the wafer 11 that has undergone the protective member affixing step S1. The protective member, denoted by 21 in FIGS. 3A and 3B, has a flexible film-shaped tape base and an adhesive layer, i.e., a glue layer, disposed on a surface of the tape base, for example.

Specifically, the tape base is made of polyolefin (PO), polyethylene terephthalate (PET), polyvinyl chloride (PVC), polystyrene (PS), or the like. The adhesive layer is made of ultraviolet-curable silicon rubber, an acryl-based material, an epoxy-based material, or the like. By pressing the adhesive layer of the protective member 21 against the face side of the wafer 11, i.e., the face side 13a of the substrate 13, the protective member 21 is affixed to the face side of the wafer 11.

Then, an outer circumferential region of the metal film 19 and a portion of an outer circumferential region of the substrate 13 on the reverse side 13b are removed, exposing the outer circumferential region of the substrate 13 and creating on the reverse side of the outer circumferential region of the wafer 11 an exposed surface where a portion closer to the face side of the wafer 11 is located radially outwardly of a portion remoter from the face side of the wafer 11 (exposed surface creating step S2).

Figure 4A:
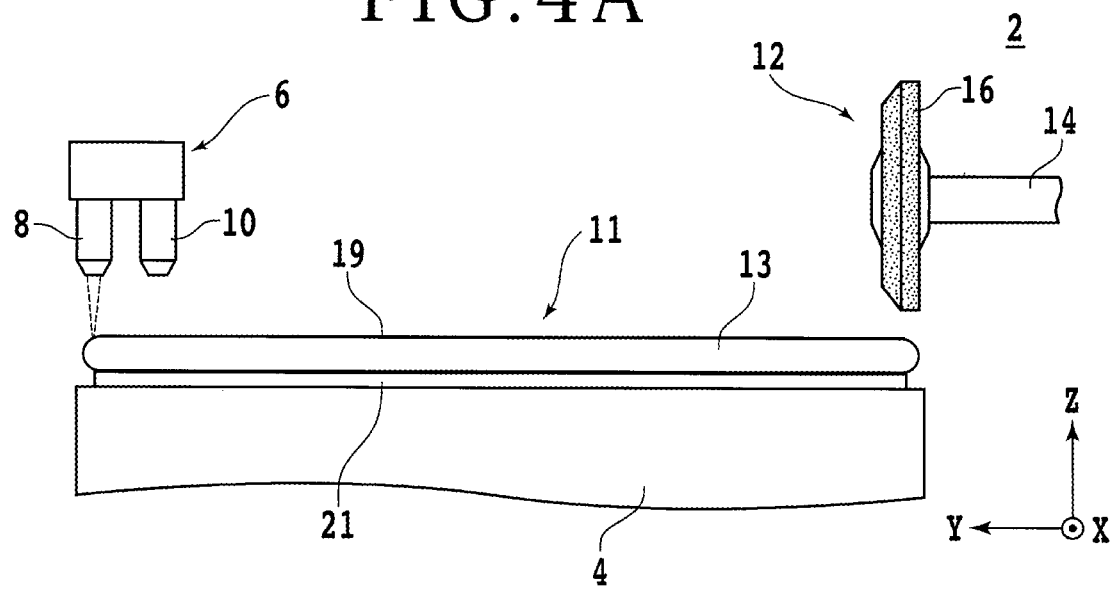
FIG. 4A is a side elevational view schematically illustrating the manner in which an image of a reverse side of an outer circumferential region of the wafer is captured.
Figure 4B:
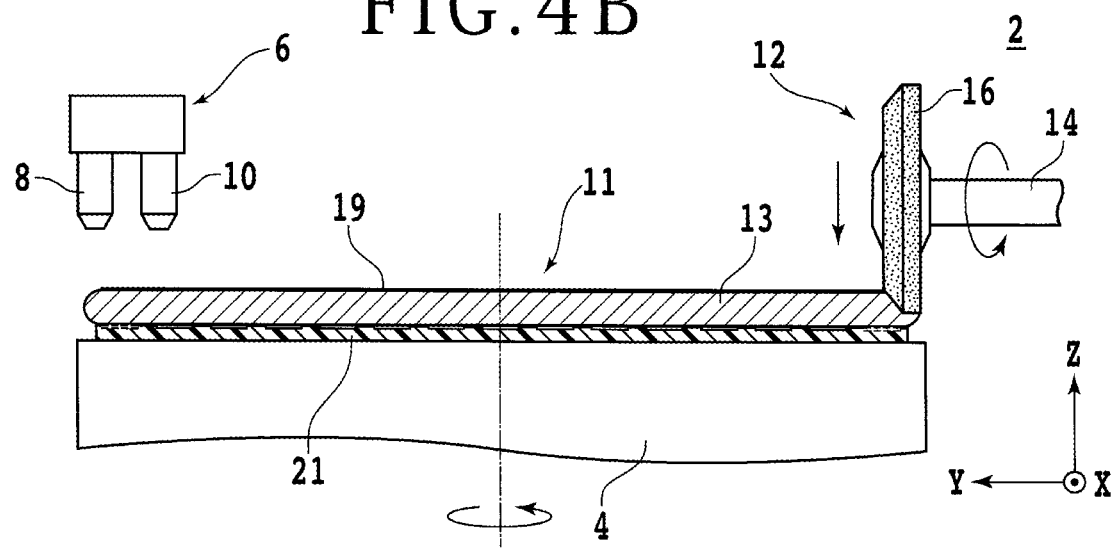
FIG. 4B is a side elevational view, partly in cross section, schematically illustrating the manner in which an exposed surface creating step is carried out.
Figure 4C:
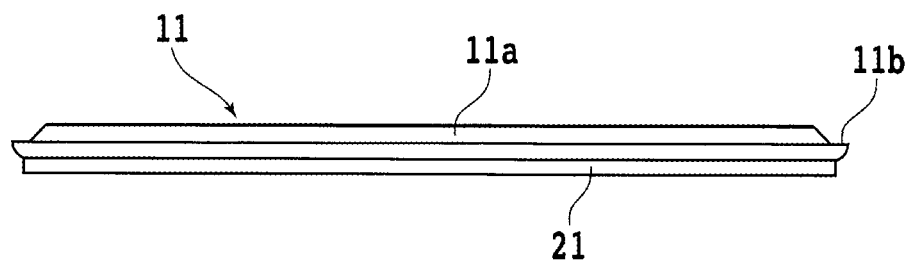
FIG. 4C is a side elevational view schematically illustrating the wafer that has undergone the exposed surface creating step.

FIG. 4A schematically illustrates in side elevation the manner in which an image of the reverse side of the outer circumferential region of the wafer 11 is captured. FIG. 4B schematically illustrates in side elevation, partly in cross section, the manner in which an exposed surface creating step S2 is carried out. FIG. 4C schematically illustrates in side elevation the wafer 11 that has undergone the exposed surface creating step S2. In FIGS. 4A and 4B, X-axis directions, i.e., leftward and rightward directions, and Y-axis directions, i.e., forward and rearward directions, extend perpendicularly to each other in a horizontal plane, and Z-axis directions, i.e., upward and downward directions, extend vertically perpendicularly to the X-axis directions and the Y-axis directions.

The exposed surface creating step S2 is performed in a cutting apparatus 2, for example. The cutting apparatus 2 has a cylindrical chuck table 4 for holding the wafer 11 thereon. The chuck table 4 is coupled to an unillustrated rotating mechanism. The chuck table 4 has a generally horizontal upper surface. When the rotating mechanism is actuated, the chuck table 4 is rotated about a rotational axis represented by a straight line that extends through the center of the upper surface thereof and perpendicularly to the upper surface.

The chuck table 4 has an unillustrated cylindrical recess defined in an upper surface thereof with an unillustrated porous plate fixedly disposed in the recess. The porous plate is in fluid communication with an unillustrated suction source, such as a vacuum pump, through an unillustrated communication passage defined in the chuck table 4. When the suction source is actuated, it generates and transmits a negative pressure through the communication passage and the porous plate to a space in the vicinity of the upper surface of the chuck table 4.

Hence, the upper surface of the chuck table 4 functions as a holding surface for holding the wafer 11 under suction thereon. When the suction source is actuated while the wafer 11 is being placed on the upper surface of the chuck table 4 with the protective member 21 interposed therebetween, the wafer 11 is held under suction on the chuck table 4.

The chuck table 4 is coupled to an unillustrated X-axis moving mechanism including a ball screw, for example. When the X-axis moving mechanism is actuated, it moves the chuck table 4 in one of the X-axis directions or the other.

An image capturing unit 6 is disposed above the chuck table 4. The image capturing unit 6 has a visible light camera 8 and an infrared camera 10 that are disposed adjacent to each other along the Y-axis directions. The visible light camera 8 is a camera for capturing an image of the upper surface of the chuck table 4 by use of visible light. The infrared camera 10 is a camera for capturing an image of the upper surface of the chuck table 4 by use of infrared rays.

The visible light camera 8 includes a light source such as a light-emitting diode (LED) that emits visible light and an image capturing device such as a charge-coupled device (CCD) image sensor or a complementary-metal-oxide-semiconductor (CMOS) image sensor, for example. The infrared camera 10 includes a light source for emitting infrared rays, an objective lens, and an image capturing device, for example.

The image capturing unit 6 is coupled to an unillustrated Z-axis moving mechanism and an unillustrated Y-axis moving mechanism that are actuatable independently of each other. Each of the Z-axis moving mechanism and the Y-axis moving mechanism includes a ball screw, for example. When the Z-axis moving mechanism is actuated, it moves the image capturing unit 6 in one of the Z-axis directions or the other. When the Y-axis moving mechanism is actuated, it moves the image capturing unit 6 in one of the Y-axis directions or the other.

The cutting apparatus 2 includes, above the chuck table 4, a cutting unit 12 having a spindle 14 extending along the Y-axis directions. The spindle 14 has a proximal end connected to an unillustrated rotary actuator, such as an electric motor. An annular cutting blade 16 for creating exposed surfaces on the wafer 11 is replaceably mounted on a distal end of the spindle 14.

The cutting blade 16 is, for example, a hub-type cutting blade including an annular base made of metal or the like and an annular cutting edge extending along an outer circumferential edge of the annular base. The cutting edge of the hub-type cutting blade 16 is made of abrasive grains of diamond, cubic Boron Nitride (cBN) or the like bound together by a bond material of nickel or the like, for example.

Alternatively, the cutting blade 16 may be a washer-type cutting blade including only an annular cutting edge. The washer-type cutting blade or cutting edge may be made of abrasive grains of diamond, cBN or the like bound together by a bond material of resin, for example.

The cutting edge of the cutting blade 16 as viewed in plan includes a front outer side surface positioned closer to the center of the chuck table 4 and shaped like a side surface of a truncated cone and a rear outer side surface positioned remoter from the center of the chuck table 4 and shaped like a side surface of a cylinder. In other words, the cutting edge has a front portion whose outside diameter is progressively smaller toward a front end thereof closer to the center of the chuck table 4 and a rear portion whose outside diameter is constant. The front portion of the cutting edge has a lower end that is closer to the chuck table 4 as illustrated in FIG. 4A and inclined with respect to the holding surface of the chuck table 4 at an angle of 45°, for example.

The cutting unit 12 is coupled to an unillustrated Z-axis moving mechanism and an unillustrated Y-axis moving mechanism that are actuatable independently of each other. Each of the Z-axis moving mechanism and the Y-axis moving mechanism includes a ball screw, for example. When the Z-axis moving mechanism is actuated, it moves the cutting unit 12 in one of the Z-axis directions or the other. When the Y-axis moving mechanism is actuated, it moves the cutting unit 12 in one of the Y-axis directions or the other.

The Z-axis moving mechanism and the Y-axis moving mechanism for moving the cutting unit 12 may double as the Z-axis moving mechanism and the Y-axis moving mechanism for moving the image capturing unit 6. In other words, the Z-axis moving mechanism and the Y-axis moving mechanism may move an integral assembly of the cutting unit 12 and the image capturing unit 6.

For performing the exposed surface creating step S2 in the cutting apparatus 2, first, the wafer 11 is placed on the holding surface of the chuck table 4 with the protective member 21 interposed therebetween, such that the center of the wafer 11 is aligned with the center of the chuck table 4. Then, the suction source fluidly coupled to the porous plate of the chuck table 4 is actuated to hold the wafer 11 under suction on the chuck table 4.

Thereafter, the visible light camera 8 captures an image of the outer circumferential region of the wafer 11 as illustrated in FIG. 4A. At this time, since visible light emitted from the visible light camera 8 is reflected by the substrate 13 and the metal film 19 on the reverse side 13b of the substrate 13, the visible light camera 8 captures an image of the reverse side of the outer circumferential region of the wafer 11 by using the reflected visible light.

Next, the chuck table 4 and/or the cutting unit 12 is moved by use of the captured image in order to position the center of the wafer 11 in one of the Y-axis directions as viewed from the spindle 14 in plan and to position the cutting blade 16 directly above the outer circumferential region of the wafer 11.

Then, while the rotary actuator coupled to the spindle 14 is rotating the spindle 14 and hence the cutting blade 16 about its central axis, the cutting unit 12 is lowered until the lower end of the front portion of the cutting edge of the cutting blade 16 is positioned at a predetermined height for contact with the outer circumferential region of the wafer 11. Then, while the cutting blade 16 is being rotated, the chuck table 4 holding the wafer 11 thereon is rotated about its central axis to make at least one revolution (see FIG. 4B).

The cutting blade 16 now removes the outer circumferential region of the metal film 19 and a portion of the outer circumferential region of the substrate 13 on the reverse side 13b, exposing the outer circumferential region of the substrate 13. At the same time, there are created on the reverse side of the outer circumferential region of the wafer 11 a first exposed surface 11a that is inclined such that a portion closer to the face side of the wafer 11 is located radially outwardly of a portion remoter from the face side of the wafer 11 and a second exposed surface 11b that is generally flat and located radially outwardly of the first exposed surface 11a (see FIG. 4C).

The first exposed surface 11a is created by the front portion of the cutting edge of the cutting blade 16 as it cuts the outer circumferential region of the metal film 19 and the outer circumferential region of the substrate 13. The first exposed surface 11a is shaped like a side surface of a truncated cone whose upper bottom surface is positioned on the reverse side of the wafer 11 and whose lower bottom surface is positioned within the wafer 11.

The second exposed surface 11b is created by the rear portion of the cutting edge of the cutting blade 16 as it cuts the outer circumferential region of the substrate 13. The second exposed surface 11b is shaped like an annular surface extending radially outwardly from the lower bottom surface of the truncated cone.

Then, in reference to an image captured of the face side of the outer circumferential region of the wafer 11, the position of a projected dicing line is specified, and an alignment process for positioning the wafer 11 and a cutting blade 18 with respect to each other is carried out (alignment step S3). Thereafter, an area of the metal film 19 along the projected dicing line is removed (metal film removing step S4).

Figure 5A:
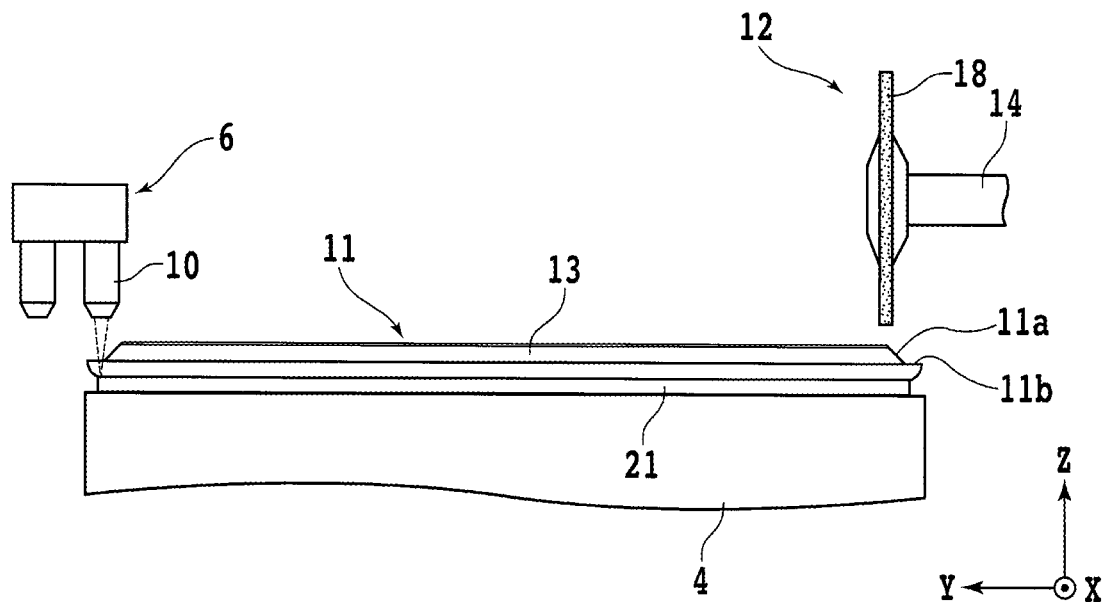
FIG. 5A is a side elevational view schematically illustrating the manner in which an image of a face side of the outer circumferential region of the wafer is captured.
Figure 5B:
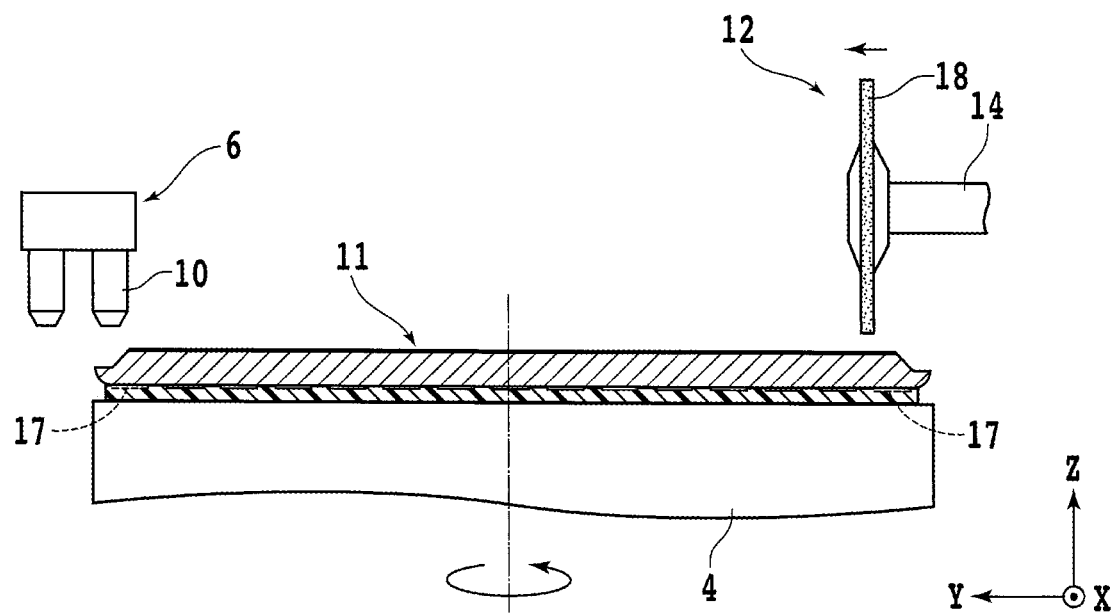
FIG. 5B is a side elevational view, partly in cross section, schematically illustrating the manner in which an alignment step is carried out.
Figure 6A:
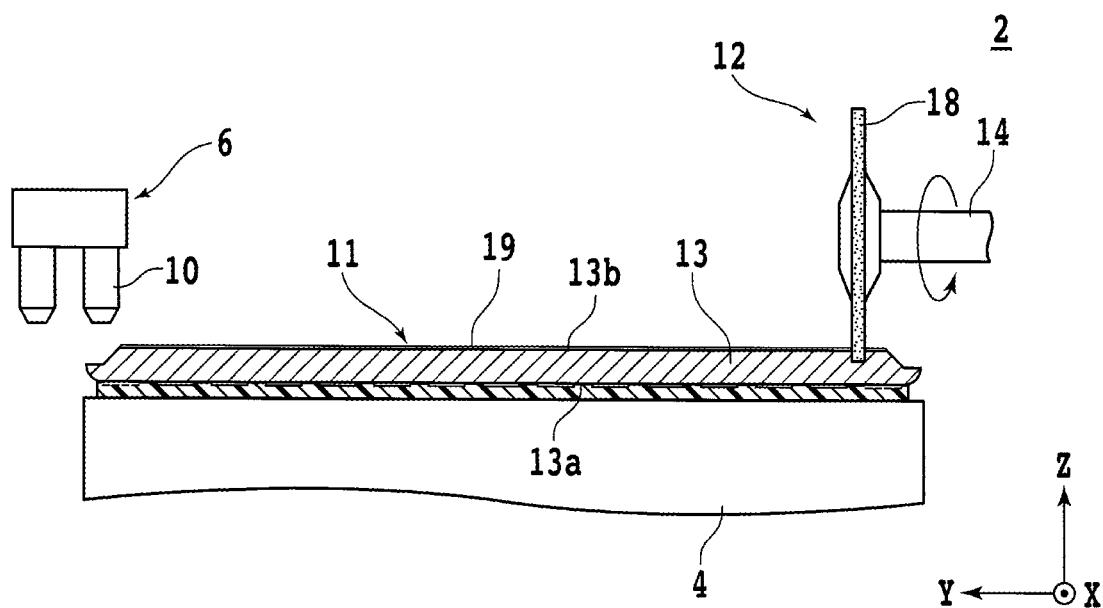
FIG. 6A is a side elevational view, partly in cross section, schematically illustrating the manner in which a metal film removing step is carried out.
Figure 6B:
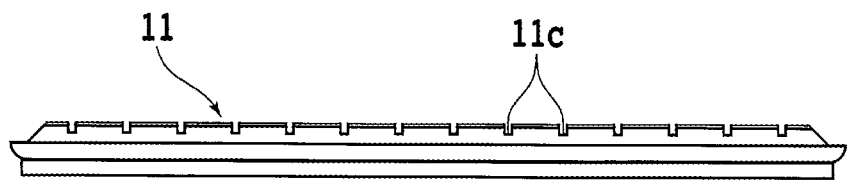
FIG. 6B is a side elevational view schematically illustrating the wafer that has undergone the metal film removing step.

FIG. 5A schematically illustrates in side elevation the manner in which an image of the face side of the outer circumferential region of the wafer 11 is captured. FIG. 5B schematically illustrates in side elevation, partly in cross section, the manner in which the alignment step S3 is carried out. FIG. 6A schematically illustrates in side elevation, partly in cross section, the manner in which the metal film removing step S4 is carried out. FIG. 6B schematically illustrates in side elevation the wafer 11 that has undergone the metal film removing step S4.

The alignment step S3 and the metal film removing step S4 are performed in the cutting apparatus 2 described above. However, before the alignment step S3 is carried out, the cutting blade 16 on the distal end of the spindle 14 for creating exposed surfaces is replaced with a cutting blade 18 for removing a metal film.

The cutting blade 18 is a hub-type or washer-type cutting blade as with the cutting blade 16. However, the cutting blade 18 has a hollow cylindrical cutting edge whose outside diameter is generally constant from a front end to a rear end thereof and has a thickness, i.e., a length along the Y-axis directions, smaller than the thickness of the cutting blade 16 and the width of each of the projected dicing lines on the wafer 11.

For performing the alignment step S3 in the cutting apparatus 2, the infrared camera 10 is used to capture the outer circumferential region of the wafer 11 (see FIG. 5A). Since infrared rays emitted from the infrared camera 10 are transmitted from the second exposed surface 11b through the substrate 13, the infrared camera 10 captures an image of the face side of the outer circumferential region of the wafer 11 by using infrared rays reflected from the face side.

Then, the position of a projected dicing line on the wafer 11 is specified in reference to the captured image. Specifically, a plurality of areas are demarcated on the outer circumferential region of the wafer 11 by a plurality of projected dicing lines, and the dummy patterns 17 are formed on the respective face sides of the areas. The captured image includes a plurality of discrete dummy patterns 17. Therefore, a position between adjacent ones of those dummy patterns 17 in the captured image can be specified as the position of a projected dicing line.

Thereafter, the alignment process is carried out to position the wafer 11 and the cutting blade 18 with respect to each other (see FIG. 5B). Specifically, the chuck table 4 that is holding the wafer 11 is rotated about its central axis to make a straight portion of the projected dicing line parallel to the X-axis directions. Then, the chuck table 4 and/or the cutting unit 12 is moved in order to position the straight portion of the projected dicing line in one of the X-axis directions as viewed from the cutting blade 18 in plan.

Thereafter, the cutting unit 12 is lowered until the cutting blade 18 has its lower end lower than the reverse side 13b of the substrate 13 but higher than the face side 13a thereof. Then, while the rotary actuator coupled to the spindle 14 is rotating the spindle 14 and hence the cutting blade 18 about its central axis, the chuck table 4 is moved to cause the cutting blade 18 to cut the wafer 11 from one end to the other thereof in one of the X-axis directions (see FIG. 6A).

In this manner, an area of the metal film 19 along the projected dicing line and an area of the substrate 13 on the reverse side 13b thereof along the projected dicing line are removed. As a result, a straight groove is formed in the reverse side of the wafer 11 along the projected dicing line. The above process is repeated to form a grid of grooves 11c in the reverse side of the wafer 11 (see FIG. 6B).

Figure 7A:
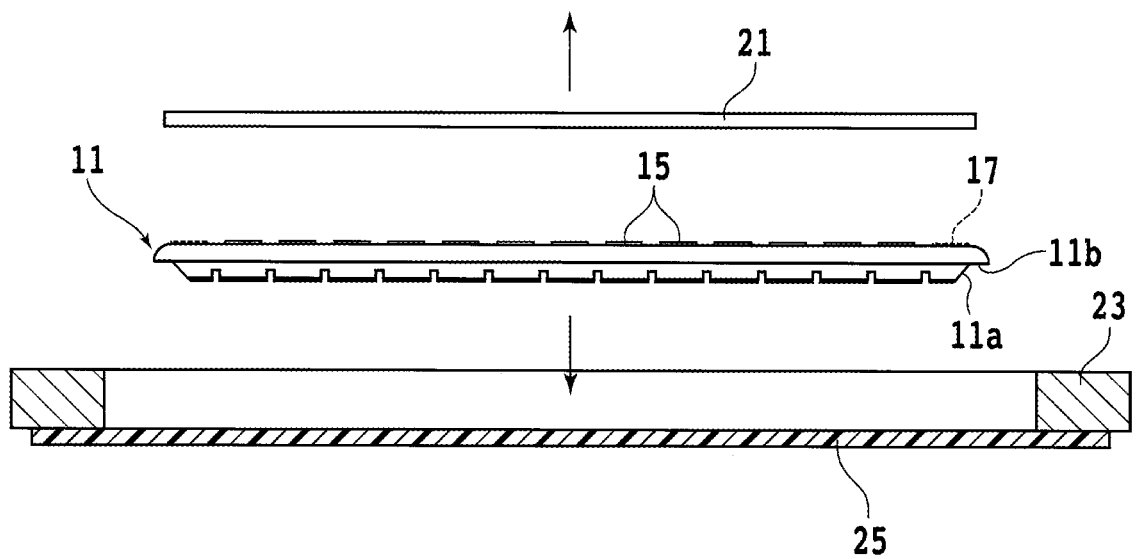
FIG. 7A is a side elevational view, partly in cross section, schematically illustrating the manner in which a work unit forming step is carried out.

Thereafter, a work unit where the wafer 11 and an annular frame are integrally combined with each other is formed by affixing the reverse side of the wafer 11 to a tape that closes the opening of the annular frame (work unit forming step S5). FIG. 7A schematically illustrates in side elevation, partly in cross section, the manner in which the work unit forming step S5 is carried out, and FIG. 7B schematically illustrates in side elevation, partly in cross section, a work unit by way of example that is formed in the work unit forming step S5.

Figure 7B:
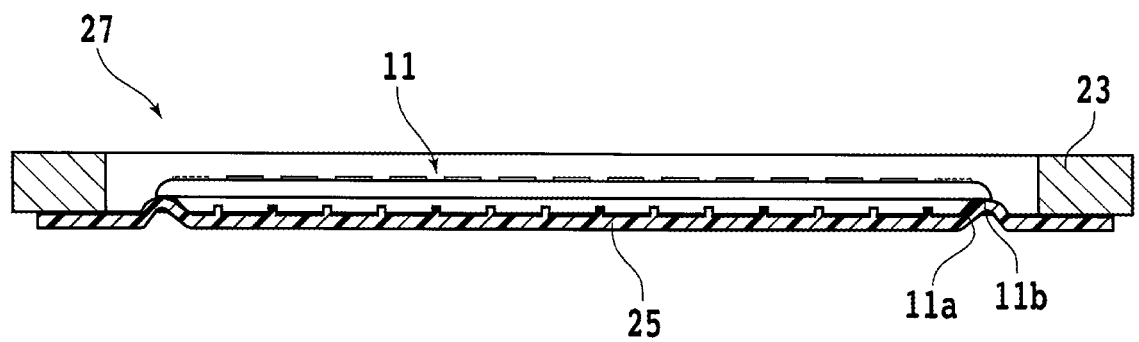
FIG. 7B is a side elevational view, partly in cross section, schematically illustrating a work unit by way of example.

An annular frame 23 illustrated in FIGS. 7A and 7B is made of a metal material, for example. A tape 25 illustrated in FIGS. 7A and 7B has a flexible film-shaped tape base and an adhesive layer, i.e., a glue layer, disposed on a surface of the tape base, as with the protective member 21. The adhesive layer of an outer circumferential region of the tape 25 is affixed to the annular frame 23, closing the opening of the annular frame 23.

In the work unit forming step S5, the protective member 21 affixed to the face side of the wafer 11 is removed, and the reverse side of the wafer 11 is pressed against the adhesive layer of a central region of the tape 25 (see FIG. 7A), thereby making up a work unit 27 where the electrode patterns 15 and the dummy patterns 17 on the face side of the wafer 11 are exposed and the wafer 11 and the annular frame 23 are integrally combined with each other (see FIG. 7B).

On the reverse side of the outer circumferential region of the wafer 11, created is the first exposed surface 11a which is shaped like a side surface of a truncated cone whose upper bottom surface is positioned on the reverse side of the wafer 11 and whose lower bottom surface is positioned within the wafer 11. In the work unit forming step S5, thus, the tape 25 can be affixed to the reverse side of the outer circumferential region of the wafer 11 which includes the first exposed surface 11a and the second exposed surface 11b, without being excessively stretched locally.

Figure 8:
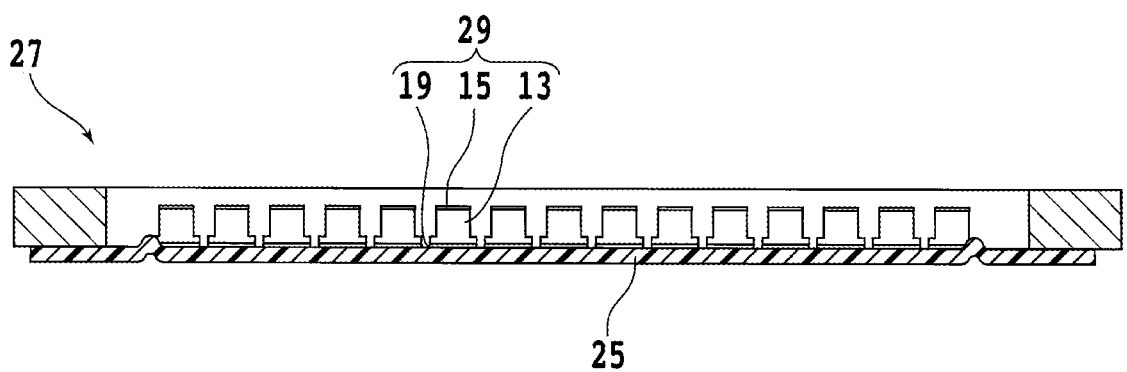
FIG. 8 is a side elevational view, partly in cross section, schematically illustrating the work unit including the wafer that has been divided.

Then, the wafer 11 is divided along the projected dicing lines (dividing step S6). The dividing step S6 is performed by plasma etching as disclosed in Japanese Patent Laid-open No. 2020-113614 referred to above, for example. FIG. 8 schematically illustrates in side elevation, partly in cross section, the work unit 27 including the wafer 11 that has been divided by plasma etching.

Specifically, in the dividing step S6 that is carried out by plasma etching, the work unit 27 where the wafer 11 is supported on the annular frame 23 by the tape 25 is placed in a chamber, and the chamber is evacuated. Then, a mask having openings defined in regions thereof along the projected dicing lines is placed on the face side of the wafer 11.

Next, plasma etching is performed on the substrate 13 from the face side of the wafer 11 through the mask. As a result, the wafer 11 is divided along the projected dicing lines, fabricating chips 29 of vertical-structure power devices including part of the substrate 13, the electrode pattern 15 and part of the metal film 19 from the device region of the wafer 11 (see FIG. 8).

According to the method illustrated in FIG. 2, before the work unit 27 is formed, the outer circumferential region of the metal film 19 and a portion of the outer circumferential region of the substrate 13 on the reverse side 13b are removed, exposing the outer circumferential region of the substrate 13 and creating on the reverse side of the outer circumferential region of the wafer 11 an exposed surface, i.e., the first exposed surface 11a, where a portion closer to the face side of the wafer 11 is located radially outwardly of a portion remoter from the face side of the wafer 11 (see exposed surface creating step S2).

Consequently, when the tape 25 is affixed to the reverse side of the wafer 11, no gap or a reduced gap is formed between the tape 25 and the outer circumferential region of the wafer 11 (see work unit forming step S5). As a consequence, when the chamber housing the work unit 27 therein is evacuated for performing plasma etching to divide the wafer 11, the probability that the tape 25 will be peeled off from the outer circumferential region of the wafer 11 is reduced.

Figure 9A:
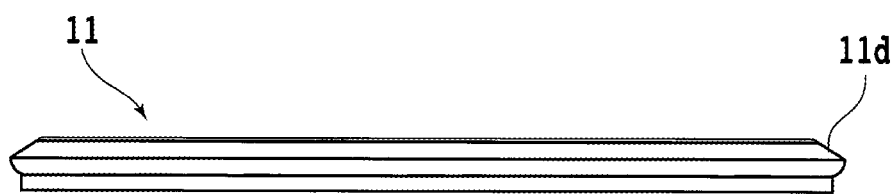
FIG. 9A is a side elevational view schematically illustrating a modified wafer that has undergone the exposed surface creating step.

The illustrated embodiment described above represents only an aspect of the present invention, and the present invention is not limited to the illustrated embodiment. According to the present invention, in the exposed surface creating step S2, as illustrated in FIG. 9A, an exposed surface 11d that is inclined such that a portion closer to the face side of the wafer 11 is located radially outwardly of a portion remoter from the face side of the wafer 11 may be created on the entire reverse side of the outer circumferential region of the wafer 11.

Figure 9B:
FIG. 9B is a side elevational view schematically illustrating another modified wafer that has undergone the exposed surface creating step.

Alternatively, according to the present invention, in the exposed surface creating step S2, as illustrated in FIG. 9B, a stepped exposed surface 11e that is inclined such that a portion closer to the face side of the wafer 11 is located radially outwardly of a portion remoter from the face side of the wafer 11 may be created on the reverse side of the outer circumferential region of the wafer 11. In other words, according to the present invention, in the exposed surface creating step S2, the second exposed surface 11b (see FIG. 4C, etc.) may not be created.

In a case where the second exposed surface 11b is created in the exposed surface creating step S2, an image can be captured of the face side of the outer circumferential region of the wafer 11, with use of infrared rays transmitted through the second exposed surface 11b that lies substantially flatwise. Hence, the second exposed surface 11b is preferable as it makes it easy to obtain a clear image to be referred to in the alignment step S3.

On the other hand, in a case where the second exposed surface 11b is not created in the exposed surface creating step S2, the width of the outer circumferential region of the wafer 11 to be removed in the exposed surface creating step S2 is reduced. Hence, the absence of the second exposed surface 11b is preferable in that the device region of the wafer 11 is increased.

Figure 10A:
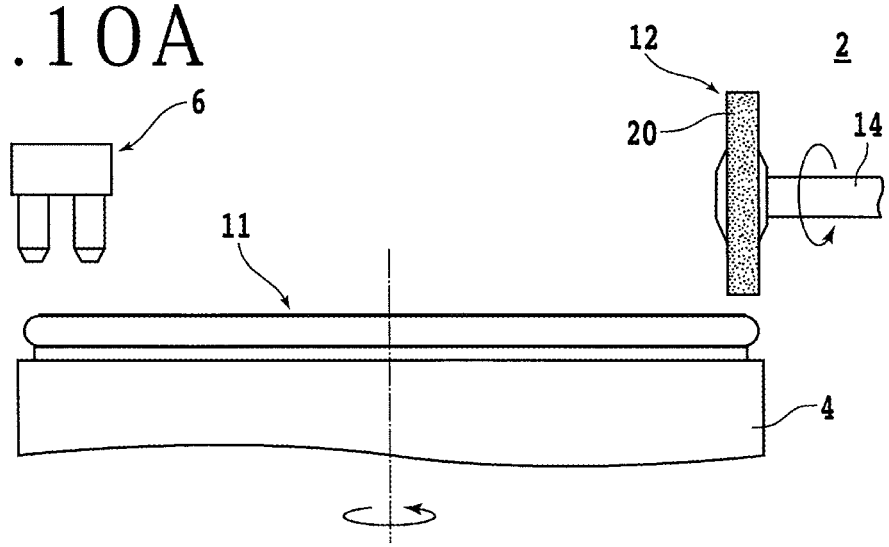
FIG. 10A is a side elevational view schematically illustrating the manner in which a modified exposed surface creating step is carried out.
Figure 10B:
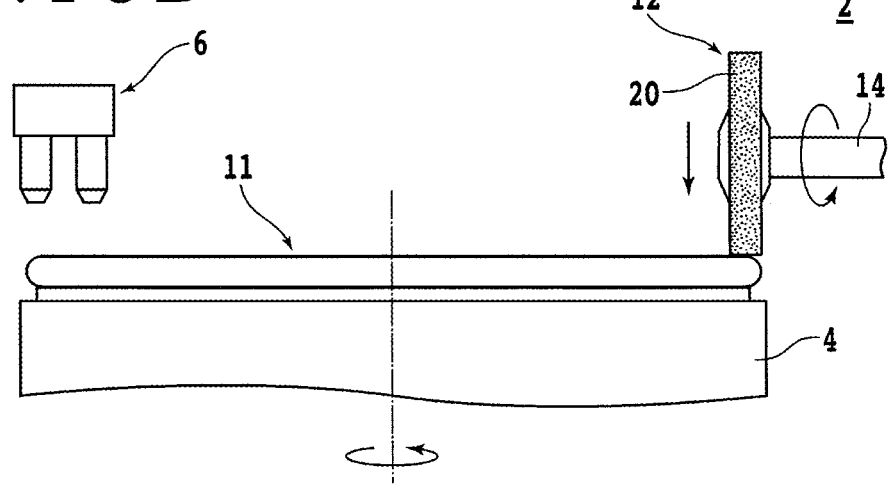
FIG. 10B is a side elevational view schematically illustrating the manner in which the modified exposed surface creating step is carried out.
Figure 10C:
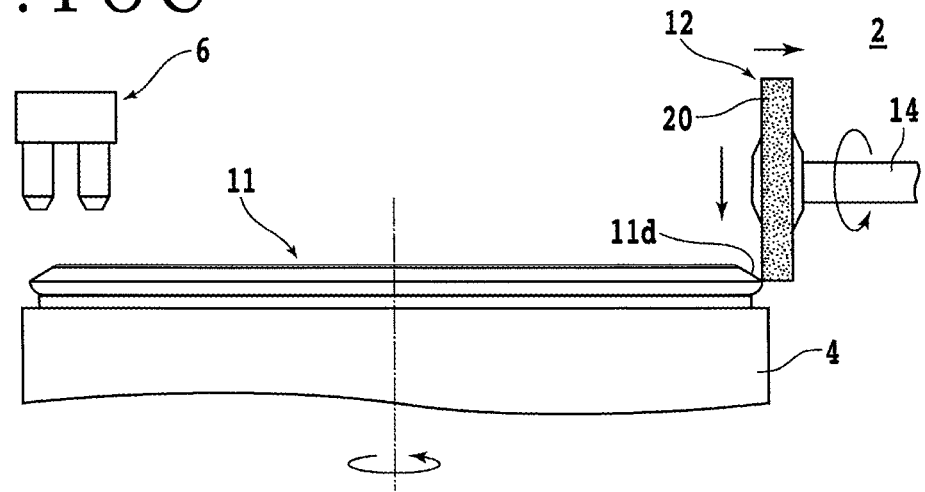
FIG. 10C is a side elevational view schematically illustrating the manner in which the modified exposed surface creating step is carried out.

In a modified exposed surface creating step S2, an exposed surface may be created using a cutting blade other than the cutting blade 16 for creating exposed surfaces. FIGS. 10A, 10B, and 10C schematically illustrate in side elevation the manner in which the modified exposed surface creating step S2 is carried out.

The modified exposed surface creating step S2 is performed in the cutting apparatus 2 described above. However, the spindle 14 supports on its distal end a cutting blade 20 for creating exposed surfaces instead of the cutting blade 16. The cutting blade 20 has a cutting edge shaped differently from the cutting edge of the cutting blade 16. Specifically, the cutting edge of the cutting blade 20 is a hollow cylindrical cutting edge whose outside diameter is generally constant from a front end to a rear end thereof.

In the modified exposed surface creating step S2, the chuck table 4 that is holding the wafer 11 thereon and the cutting blade 20 are rotated respectively about their central axes (see FIG. 10A). Then, while the chuck table 4 and the cutting blade 20 are being rotated, the cutting unit 12 is lowered until the cutting blade 20 is brought into contact with the reverse side of the outer circumferential region of the wafer 11 (see FIG. 10B).

Then, while the chuck table 4 and the cutting blade 20 are being rotated and the cutting unit 12 is being lowered, the cutting unit 12 is moved away from the chuck table 4 in one of the Y-axis directions (see FIG. 10C). The cutting blade 20 thereby creates the exposed surface 11d illustrated in FIG. 9A on the reverse side of the outer circumferential region of the wafer 11.

In the exposed surface creating step S2, a helical stepped exposed surface may be created on the reverse side of the outer circumferential region of the wafer 11 by lowering the rotational speed of the chuck table 4 that is holding the wafer 11. Moreover, in the exposed surface creating step S2, the cutting unit 12 may be lowered and moved in one of the Y-axis directions alternately, but not simultaneously, to create the stepped exposed surface 11e as illustrated in FIG. 9B.

Furthermore, according to the present invention, in the metal film removing step S4, the regions of the metal film 19 along the projected dicing lines may be removed by way of laser ablation. A laser beam that is used to remove the regions by way of laser ablation in the metal film removing step S4 may be, for example, a pulsed laser beam having a wavelength of 532 nm, for example, absorbable by the metal film 19.

In the metal film removing step S4, for example, the regions of the metal film 19 along the projected dicing lines may be removed by application of a laser beam having a repetitive frequency ranging from 10 to 200 kHz and a spot diameter ranging from 1 to 2 μm to the metal film 19 along the projected dicing lines on the wafer 11.

Moreover, according to the present invention, in the dividing step S6, the wafer 11 may be divided by a process other than plasma etching. For example, according to the present invention, in the dividing step S6, the wafer 11 may be divided by bringing a rotating annular cutting blade, i.e., a cutting blade for dividing a substrate, into contact with the substrate 13 from the face side 13a thereof along the projected dicing lines.

In this case, the wafer 11 is cut and divided while no gap or a reduced gap is being formed between the tape 25 and the outer circumferential region of the wafer 11. Consequently, the wafer 11 contacted by the cutting blade that rotates while the wafer 11 is being divided is restrained from vibrating. As a result, the probability that chips produced by the wafer 11 being divided will produce fragments called chippings from their ends is reduced.

Moreover, according to the present invention, in the dividing step S6, modified layers may be formed within the wafer 11 by a laser beam, and then external forces may be exerted on the wafer 11 to divide the wafer 11 at the modified layers that function as division initiating points. The laser beam used in the dividing step S6 may be, for example, a pulsed laser beam having a wavelength of 1064 nm, for example, that is transmittable through the substrate 13.

In the dividing step S6, for example, modified layers may be formed within the wafer 11 by application of a laser beam having a repetitive frequency ranging from 10 to 50 kHz and a focused spot positioned within the substrate 13 to the wafer 11 from the face side 13a of the substrate 13 along the projected dicing lines on the wafer 11.

In this case, external forces are exerted on the wafer 11 to divide the wafer 11 while no gap or a reduced gap is being formed between the tape 25 and the outer circumferential region of the wafer 11. Consequently, the probability that chips including part of the outer circumferential region of the wafer 11 are peeled off from the tape 25 and fly off while the wafer 11 is being divided is reduced.

Moreover, according to the present invention, in the dividing step S6, the wafer 11 may be divided by way of laser ablation. A laser beam that is used to divide the wafer 11 by way of laser ablation in dividing step S6 may be, for example, a pulsed laser beam having a wavelength of 355 nm, for example, absorbable by the substrate 13.

In the dividing step S6, for example, the wafer 11 may be divided by application of a laser beam having a repetitive frequency ranging from 10 to 200 kHz and a spot diameter ranging from 1 to 10 μm to the substrate 13 from the face side 13a thereof along the projected dicing lines on the wafer 11.

In this case, the wafer 11 is divided by way of laser ablation occurring thereon while no gap or a reduced gap is being formed between the tape 25 and the outer circumferential region of the wafer 11. Consequently, the tape 25 is restrained from being peeled off from the outer circumferential region of the wafer 11 due to the wafer 11 being heated by laser ablation.

The structure, method, etc., according to the above embodiment may be changed or modified appropriately without departing from the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing chips by dividing a wafer that includes a substrate and a metal film covering a reverse side of the substrate along a grid of projected dicing lines on the wafer, comprising:
    a protective member affixing step of affixing a protective member to a face side of the wafer that is positioned opposite the metal film;
    an exposed surface creating step of, after the protective member affixing step, while the wafer is being held through the protective member, removing an outer circumferential region of the metal film and a portion of an outer circumferential region of the substrate on the reverse side thereof, thereby exposing the outer circumferential region of the substrate and creating on a reverse side of an outer circumferential region of the wafer an exposed surface where a portion closer to the face side of the wafer is located outwardly of a portion remoter from the face side of the wafer;
    an alignment step of, after the exposed surface creating step, specifying a position of a projected dicing line and performing an alignment process in reference to an image captured of a face side of the outer circumferential region of the wafer by applying light having a wavelength transmittable through the substrate from a reverse side of the wafer;
    a metal film removing step of, after the alignment step, removing regions of the metal film along the projected dicing lines while the wafer is being held through the protective member;
    a work unit forming step of, after the metal film removing step, removing the protective member from the face side of the wafer and affixing the reverse side of the wafer to a tape that closes an opening of an annular frame, thereby forming a work unit where the wafer and the annular frame are integrally combined with each other; and
    a dividing step of, after the work unit forming step, dividing the wafer along the projected dicing lines while the wafer is being held through the tape.

2. The method of manufacturing chips according to claim 1, wherein the dividing step includes steps of placing a mask having openings defined in regions thereof along the projected dicing lines on the face side of the wafer and thereafter performing plasma etching on the substrate through the mask, thereby dividing the wafer.

3. The method of manufacturing chips according to claim 1, wherein the dividing step includes a step of bringing a rotating annular blade for dividing a substrate into contact with the substrate from a face side thereof along the projected dicing lines, thereby dividing the wafer.

4. The method of manufacturing chips according to claim 1, wherein the dividing step includes steps of forming modified layers within the substrate by applying a laser beam having a wavelength transmittable through the substrate and a focused spot positioned within the substrate to the substrate from a face side thereof along the projected dicing lines, and thereafter exerting external forces on the substrate, thereby dividing the wafer at the modified layers that function as division initiating points.

5. The method of manufacturing chips according to claim 1, wherein the dividing step includes a step of applying a laser beam having a wavelength absorbable by the substrate to the substrate from a face side thereof along the projected dicing lines, thereby dividing the wafer.

6. The method of manufacturing chips according to claim 1, wherein the metal film removing step includes a step of bringing a rotating annular cutting blade for removing a metal film into contact with the metal film, thereby removing the regions of the metal film along the projected dicing lines.

7. The method of manufacturing chips according to claim 1, wherein the metal film removing step includes a step of applying a laser beam having a wavelength absorbable by the metal film to the metal film, thereby removing the regions of the metal film along the projected dicing lines.

8. The method of manufacturing chips according to claim 1, wherein the exposed surface creating step includes a step of bringing a rotating annular cutting blade for creating an exposed surface into contact with the metal film and the substrate, thereby removing the outer circumferential region of the metal film and the portion of the outer circumferential region of the substrate on the reverse side thereof.

* * * * *